(12) United States Patent
Schols et al.

(10) Patent No.: US 7,977,672 B2
(45) Date of Patent: Jul. 12, 2011

(54) ORGANIC LIGHT-EMITTING DEVICE WITH FIELD-EFFECT ENHANCED MOBILITY

(75) Inventors: Sarah Schols, Kessel-Lo (BE); Stijn Verlaak, Tongeren (BE); Paul Heremans, Leuven (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 12/788,955

(22) Filed: May 27, 2010

(65) Prior Publication Data

US 2010/0230668 A1     Sep. 16, 2010

Related U.S. Application Data

(63) Continuation of application No. 11/652,936, filed on Jan. 12, 2007, now Pat. No. 7,768,019.

(60) Provisional application No. 60/759,260, filed on Jan. 13, 2006.

(51) Int. Cl.
*H01L 27/15* (2006.01)
*H01L 31/12* (2006.01)
*H01L 33/00* (2010.01)

(52) U.S. Cl. ........ 257/40; 257/79; 257/87; 257/E51.001; 257/E51.018

(58) Field of Classification Search .............. 257/40, 257/79, 87, E51.001, E51.018
See application file for complete search history.

(56) References Cited

U.S. PATENT DOCUMENTS

| | | |
|---|---|---|
| 4,539,507 A | 9/1985 | Van Slyke et al. |
| 5,245,622 A | 9/1993 | Jewell et al. |
| 6,720,572 B1 | 4/2004 | Jackson et al. |
| 7,211,335 B2 | 5/2007 | Hwang et al. |
| 2001/0035580 A1 | 11/2001 | Kawai |
| 2001/0040245 A1 | 11/2001 | Kawai |
| 2003/0132448 A1 | 7/2003 | Tsujimura et al. |
| 2005/0074973 A1 | 4/2005 | Ouchi et al. |

OTHER PUBLICATIONS

De Vusser et al., "Light-Emitting Organic Field-Effect Transistors Using an Organic Heterostructure Inside the Transistor Channel", Applied Physics Letters 89, 2006, 223504.
V. G. Kozlov et al, "Structures for Organic Diode Lasers and Optical Properties of Organic Semiconductors Under Intense Optical and Electrical Excitations," IEEE Journal of Quantum Electronics, vol. 36, No. 1, Jan. 2000.
Search Report from European Application No. EP 07 00 0671, dated Apr. 17, 2007.
Seeds for Tomorrow's World, Imecnology, "Organic Light-Emitting Field-Effect Transistors using Patterned Growth of two Organic Semiconductors", Mar. 28, 2005.
J.H. Schon et al., "A Light-Emitting Field-Effect Transistor", vol. 290, Nov. 3, 2000, pp. 963-965.

*Primary Examiner* — Shouxiang Hu
(74) *Attorney, Agent, or Firm* — McDonnell Boehnen Hulbert & Berghoff

(57) ABSTRACT

A two-terminal organic light-emitting device structure is presented with low absorption losses and high current densities. Light generation and emission occur at a predetermined distance from any metallic contact, thereby reducing optical absorption losses. High current densities and thus high emitted light intensity are achieved by combining two types of conduction in one device: by combining space charge limited conduction and field-effect conduction or by combining ohmic conduction and field-effect conduction, thereby optimizing the current densities. This results in a very high local concentration of excitons and therefore a high light intensity, which can be important for applications such as organic lasers, and more in particular electrically pumped organic lasers.

36 Claims, 12 Drawing Sheets

ORGANIC LIGHT-EMITTING DEVICE WITH FIELD-EFFECT ENHANCED MOBILITY

CROSS REFRENCED RELATED APPLICATIONS AND CLAIM OF PRIORITY

The present application is a continuation of U.S. patent application Ser. No. 11/652,936, which is incorporated by reference herein in its entirety.

The present application claims priority to U.S. patent application Ser. No. 11/652,936 filed on Jan. 12, 2007, which claims priority to U.S. Provisional Patent Application Ser. No. 60/759,260 filed on Jan. 13, 2006.

BACKGROUND

The present disclosure is related to the field of organic and polymer electronics, more specifically it is related to the field of organic light-emitting devices.

In the last decade, remarkable progress has been made in synthesizing conjugated polymers, in understanding their properties and in developing them for use in electronic and optical devices. Currently, different types of devices can be made by using these materials, for example organic light-emitting diodes (OLEDs), organic photo detectors, organic photovoltaic cells and organic field-effect transistors.

Organic light-emitting devices are typically generated by sandwiching one or more appropriate organic layers between two conductive electrodes. This concept is proposed in U.S. Pat. No. 4,539,507. When an electric field is applied to the device, negatively charged carriers are injected into the organic layer or organic layers from one electrode, and positively charged carriers are injected into the organic layer or organic layers from the other electrode. Under influence of the applied field, the injected carriers travel through the organic layer or organic layers. When two oppositely charged carriers meet each other on one molecule or polymer segment, they recombine and emit light.

Another example of prior art organic light-emitting devices is the organic light emitter with improved carrier injection as disclosed in U.S. Pat. No. 6,720,572. This device comprises an organic light-emitting layer and an organic semiconductor layer that enhances injection, interposed between two contacts. This device can also be a transistor comprising three electrodes, a gate, a drain and a source. By applying a gate bias, charge carriers are accumulated at the interface between the semiconductor and the gate dielectric. If an additional drain bias is supplied, these carriers are injected into the light-emitting layer, where they can recombine and emit light.

The main disadvantage of the former light-emitting devices is that the light emission occurs very close to a metallic contact. When the light output is mainly perpendicular to the surface of the device, the presence of a metallic contact at a distance of 30 nm or more from the place of photon creation is acceptable. This is how a light-emitting diode is normally used. However, if it is the intention to guide photons in a waveguide, where the waveguide includes the physical layer in which the photons are generated, the close proximity of the metal contact introduces high optical absorption losses. In the state-of-the-art different solutions exist to circumvent this problem.

J. H. Schön et al. introduced the idea of an ambipolar light-emitting transistor, in "A Light-Emitting Field-Effect Transistor", Science, 2000, 290 (3), 963-965. This device comprises three contacts, a gate dielectric and an ambipolar light-emitting semiconductor material. By applying an appropriate bias to the drain and the gate electrode, electrons and holes are injected from the source and the drain. As the ambipolar material can conduct both types of carriers, the holes and electrons recombine between the two contacts.

Another example of prior art organic light-emitting devices, having the light emission far away from the contacts, is the three-terminal light-emitting transistor reported by S. De Vusser et al., in "Light-emitting organic field-effect transistor using an organic heterostructure within the transistor channel", Applied Physics Letters 89, 2006, 223504. The light-emitting devices comprise a heterojunction in the accumulation channel.

The disadvantages, however, of the transistor structures of J. H. Schön et al. and S. De Vusser et al. are threefold. In the first place, for a given maximum voltage bias, only relatively low current densities can be achieved, resulting in low intensities of the emitted light. Secondly, the devices are three-terminal devices. Finally, the device structure makes it difficult to incorporate an additional light-emitting layer.

SUMMARY

It is an aim of the present invention to provide a good two-contact, light-emitting device structure, with on the one hand a significant distance between a metal contact and the place where photons are generated and on the other hand the ability to sustain current densities that compare favourably with prior art two-terminal organic light-emitting devices.

In embodiments of the present disclosure, a two-contact, light-emitting device structure is provided, with low optical absorption losses, preferably with reduced or minimized optical absorption losses compared to prior art light-emitting devices, while still allowing for high current densities, for example with current densities at least at the same level as in prior art light-emitting devices. In embodiments of the present disclosure, a two-contact, light-emitting device structure is provided where light generation and emission occur at a predetermined distance from any metallic contact, the distance being larger than in prior art two-terminal OLEDs. This is a considerable improvement when compared to devices wherein light emission occurs very close to a metallic contact, thus introducing optical absorption losses that limit the optical performance of the light-emitting devices, in particular when the light is coupled into a waveguide that physically includes the light-emitting layer.

In the state-of-the-art, a structure that is known to allow light-emission at a distance from a contact is the light-emitting transistor described by J. H. Schön et al. in "A Light-Emitting Field-Effect Transistor", Science, 2000, 290 (3), 963-965 and by S. De Vusser et al. in "Light-emitting organic field-effect transistor using an organic heterostructure within the transistor channel", Applied Physics Letters 89, 2006, 223504. In contrast to such devices, a light-emitting device in accordance with embodiments of the present disclosure is a two-terminal device. A light-emitting device in accordance with embodiments of the present disclosure furthermore has the advantage of providing higher current densities for a given bias. This feature of the disclosed embodiments is achieved by combining two types of conduction in one device, e.g. space charge limited conduction and field-effect conduction, or ohmic conduction and field-effect conduction, thereby optimizing the current densities. This results in a very high local concentration of excitons and therefore a high light intensity, which can be important for applications such as organic lasers, and particularly for electrically-pumped organic lasers. An exciton is a bound electron-hole pair on one molecule or on neighbouring molecules.

A light-emitting device in accordance with embodiments of the present disclosure is a two-terminal device comprising an active layer, a first electrode substantially lying in a plane, the first electrode being for injecting charge carriers of a first type into the active layer, a second electrode for injecting charge carriers of a second type into the active layer, the second type of charge carriers being of opposite polarity from the first type of charge carriers, and a patterned electrically insulating layer in contact with the active layer. The active layer comprises at least one organic semiconductor layer. At least part of the electrically insulating layer overlays part of the first electrode. The electrically insulating layer has an insulator edge, being the edge of the insulating layer overlaying the first electrode and formed by the intersection of the plane of the insulating layer top surface, which is the surface not facing the first charge injecting electrode, and the plane of the insulating layer side surface, which is not parallel to the top surface and which results from patterning the insulating layer. At least part of the second electrode overlays part of the electrically insulating layer, but not the insulator edge, there being a predetermined distance between the insulator edge and the second electrode in a direction parallel to the plane of the first electrode. At least part of the second electrode overlays part of the first electrode. The active layer is in contact with part of the first electrode, at least part of the second electrode and at least part of the electrically insulating layer.

In the light-emitting device according to embodiments of the present disclosure, the predetermined distance over which the second electrode is displaced with respect to the insulator edge may be at least 100 nm, preferably between 100 nm and 1000 micrometer, more preferably between 1 micrometer and 10 micrometer.

The thickness of the insulating layer may be between 1 nm and 1 micrometer, more preferably between 50 nm and 200 nm. The insulating layer material may be selected from the group consisting of silicon dioxide, aluminum oxide, tantalum pentoxide, hafnium oxide, enzocyclobutene (BCB), polyimide, poly vinyl phenol, polystyrene, poly vinyl alcohol, self-assembled monolayers, low k dielectrics, high k dielectrics and ferro-electric insulators, though other insulators may alternatively used in implementation of the embodiments described herein.

The at least one organic semiconductor layer may comprise small molecules, polymers or metal complexes. Small molecules, with a molecular mass of between 2 and 10,000, may be selected from the group consisting of tetracene, pentacene, perylenes, oligothiophens (terthiophenes, tetrathiophene, quinquethiophene or sexithiophene), bora-diazaindacene fluorophores, trishydroxyquinoline aluminium (Alq3) and tetraphenyldiamine. Polymers may be selected from the group consisting of polyphenylenenvinylene, polyfluorene, polytrialeneamine and polythiophene. The metal complex may be for example Pt-octaethylporphyrine, Tris(2-phenylpyridine)iridium (III) or Iridium (III) bis(2-(2'-benzothienyl)pyridinato-N,C$^3$)(acetylacetonate). The foregoing small molecules, polymers, and metal complexes are provided by way of example, but the use of alternative materials in the embodiments described herein is also contemplated.

The active layer may comprise a first organic semiconductor layer contacting the first electrode and a second organic semiconductor layer contacting the second electrode. In a preferred embodiment of the present invention the first organic semiconductor layer may comprise polymers and the second organic semiconductor layer may comprise small molecules.

In the two-terminal light-emitting device in accordance with embodiments of the present disclosure, the active layer, the first electrode, the second electrode and the electrically insulating layer are selected and positioned such that the first type of charge carriers diffuses by ohmic conduction or by space charge limited conduction and the second type of charge carriers drifts by field-effect conduction over the predetermined distance between the isolator edge and the second electrode, before recombining and emitting light.

In a preferred embodiment, the field-effect conduction may take place in one of the at least one organic semiconductor layer of the active layer, characterized by a high mobility for the second type of charge carriers. The organic semiconductor with high mobility for the second type of charge carriers may be selected from the group consisting of NN'-Ditridecylperylene-3,4,9,10 tetracarboxylic diimide (PTCDI-C13H27), pentacene, tetracene, Phthalocyanines (e.g. CuPc, F16Pc), fullerene, polytrialene amine (PTAA) and Poly(3-hexyl thiophene) (P3HT). The foregoing high-mobility organic semiconductors are provided by way of example, but the use of alternative materials in the embodiments described herein is also contemplated. Such semiconductors of high mobility preferably have a mobility higher than $1 \times 10^{-3}$ cm$^2$/Vs.

In an embodiment described in the present disclosure, part of the second electrode may overlay part of the insulating layer and the remainder of the second electrode may overlay any electrically insulating layer positioned in between the first electrode and the second electrode, such that there is essentially no parasitic electrical path between the first electrode and the second electrode.

At least one of the at least one organic semiconductor layer may be at least partially electrochemically doped with dopants. Dopants may be selected from the group consisting of I, Fe3Cl, 2,3,5,6-tetrafluoro-7,7,8,8-tetracyanoquinodimethane (F4-TCNQ), Ca and polystyrenesulfonate (PSS), though other dopants may alternatively be used.

The active layer of the two-terminal light-emitting device in accordance with embodiments described in the present disclosure may further comprise at least one additional organic layer selected from the group consisting of light-emitting layers, electron-blocking layers, hole-blocking layers, transport layers and optical confinement layers. The at least one additional organic layer may be a structure of materials with lower refractive index than that of the layer emitting light. The light-emitting layer may be doped with light-emitting species, such as DCM, rubrene, or Btp2Ir(acac), among others.

The first electrode and the second electrode may comprise materials with a low barrier for the injection of charge carriers in said at least one organic semiconductor layer. The first electrode and the second electrode may comprise a material selected from the group consisting of Au, Ca, Mg, LiF:Al, Al, In, C, Perovskite Manganites (Re1-xAxMnO3), indium-tin-oxide, titanium oxide, zinc oxide, Cr, Cu, Fe, Ag, poly(3,4-ethylenedioxythiophene) combined with poly(styrene sulfonate) or may comprise inks or nanoparticle solutions based on a material selected from this group. These electrode materials are provided by way of example, but it is contemplated that the embodiments described herein may be implemented with alternative materials.

The first electrode may be transparent to light emitted by the light-emitting device. Such transparent electrode may comprise a material selected form the group consisting of indium-tin-oxide, zinc oxide, titanium oxide and polyethylenedioxythiophene:polystyrenesulfonate (Pedot:PSS), though other transparent electrode materials may be used as alternatives.

The light-emitting device in accordance with embodiments described in the present disclosure may comprise an optical feedback structure, such as for example a distributed Bragg reflector, a distributed optical feedback structure or a mirror.

The light-emitting device in accordance with embodiments described in the present disclosure may comprise at least one optical confinement structure and at least one optical resonator, wherein the at least one optical confinement structure and the at least one optical resonator are arranged such that the light emitted by the light-emitting device is coherent and laser emission is achieved.

The present disclosure further relates to a method of manufacturing a two-terminal light-emitting device according to embodiments described above.

Furthermore the present disclosure relates to a method for emitting light from a two-terminal device according to embodiments described above. The method of emitting light according to embodiments described in the present disclosure comprises injecting charge carriers of a first type from the first electrode into the active layer, injecting charge carriers of a second type from the second electrode into the active layer, the second type of charge carriers being of opposite polarity from the first type of charge carriers, and inducing recombination of the first type of charge carriers with the second type of charge carriers at a pre-determined distance from the second electrode, in a direction substantially parallel to the plane of the first electrode.

The method for emitting light according to embodiments described in the present disclosure may furthermore comprise forming an accumulation layer of the second type of charge carriers in the active layer, for example at the heterojunction between the insulating layer and the active layer or at the heterojunction between two organic semiconductor layers of the active layer. The method for emitting light according to embodiments described in the present disclosure may furthermore comprise transporting the first type of charge carriers by space charge limited conduction or by ohmic conduction and transporting the second type of charge carriers by field-effect conduction.

The two-terminal light-emitting device in accordance with embodiments described in the present disclosure may be used by applying a continuous bias voltage between the first electrode and the second electrode or by applying a pulsed bias voltage between the first electrode and the second electrode, whereby charge carriers are injected in the active layer during the pulses. When operating the device with a pulsed bias voltage, the pulse duration may be typically between 1 ns and 100 ns, with a time interval between the pulses typically between 1 μs and 1 s. These times are optimized such that the pulse duration may be longer that the radiative recombination lifetime of singlet excitons but shorter than the lifetime of triplet excitons, while the time interval between the pulses may be longer than the lifetime of triplet excitons. Additionally, a charge carrier extraction pulse may be provided at each time interval between the pulses of the pulsed bias voltage, whereby the charge carrier extraction pulse has opposite polarity as compared to the charge injecting pulses of the pulsed bias voltage.

Particular and preferred aspects of the invention can be found in the independent and dependent claims. Features of the dependent claims may be combined with features of the independent claims and with features of other dependent claims as appropriate and not merely as explicitly set out in the claims.

The above and other characteristics, features, and advantages of embodiments described in the present disclosure will be clarified in the following detailed description in combination with the drawings, which illustrate, by way of example, the principles of the invention. This description is given as an example only, without limiting the scope of the invention.

BRIEF DESCRIPTION OF THE DRAWINGS

FIG. 1.b is a cross-sectional view of an alternative configuration of the embodiment depicted in FIG. 1.a. In this configuration the second charge injecting electrode 10 is deposited on the insulator 13 first, prior to application of the organic semiconductor layer 15.

FIG. 1.c is a graph showing the potential drop at the cross-section 19 of FIG. 1.a or FIG. 1b. 191 is an accumulation layer of charge carriers formed in the organic semiconductor layer 15 at the interface with insulator 13.

FIG. 2.b is a cross-sectional view of an alternative configuration of the embodiment depicted in FIG. 2.a. In this configuration the second charge injecting electrode 20 is deposited after deposition of the first organic semiconductor layer 25 and prior to the deposition of the second organic semiconductor layer 26.

FIG. 3.b is a cross-sectional view of an alternative configuration of the embodiment depicted in FIG. 3.a. In this configuration the second charge injecting electrode 30 is deposited first, prior to the deposition of the second organic semiconductor layer 36.

In FIG. 6.c both electrodes touch the underlying substrate.

In FIG. 7.a, the electrodes of a device corresponding to the embodiment shown in FIG. 2, are essentially rectangular. FIG. 7.b shows the corresponding top view. In FIG. 7.c the electrodes are essentially circular. FIG. 7.d is a top view of this circular configuration.

In FIG. 11.a, resonators 70 are positioned around a device corresponding to the embodiment shown in FIG. 2, in such a way that feedback is generated in the lateral direction. 71 is the direction in which feedback is generated. In FIG. 11.b, resonators 72 are positioned around a device corresponding to the embodiment illustrated in FIG. 2, so as to generate feedback in the vertical direction, indicated by arrow 73.

In FIGS. 12.a and 12.b, 121 is a pulse with a bias condition corresponding to injection of charge carriers in the active layer and 122 is the interval between pulses. The bias scheme of FIG. 12.b shows the (optional) bias condition 123 for removing charge carriers from the device.

DETAILED DESCRIPTION

Figure 1A:
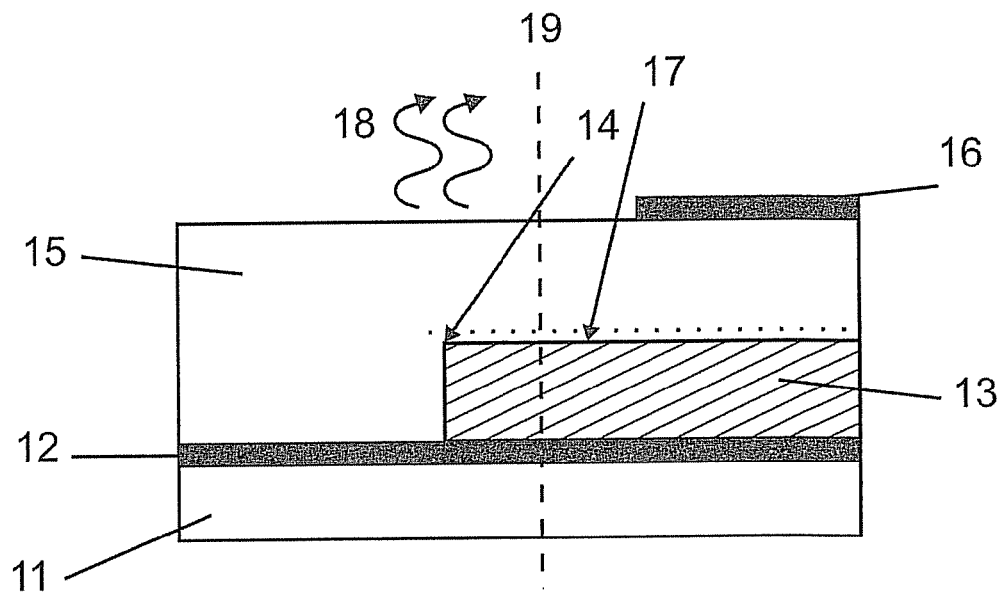
FIG. 1.a is a cross-sectional view of a light-emitting device in accordance with an embodiment described in the present disclosure, wherein 11 is the substrate, 12 is a first charge injecting electrode, 13 is an insulator, 14 is the insulator edge, 15 is an organic semiconductor layer, 16 is a second charge injecting electrode, 17 is the interface between the insulator 13 and the organic semiconductor layer 15, the dots at the interface represent the accumulation layer (indicated with 191 in FIG. 1.c), 18 is the emitted light and 19 is the position of a cross-section.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments described herein can operate in other orientations than described or illustrated herein.

The term "comprising", used in the claims, should not be interpreted as being restricted to the elements listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B.

In organic devices there are three main types of charge conduction, namely ohmic conduction, space charge limited conduction and field-effect conduction. The term conduction, used in the context of this text, comprises two different aspects. It indicates a way of creating a certain charge carrier density, and it also refers to charge carrier mobility.

Ohmic conduction and space charge limited conduction are typical for organic light-emitting diodes and organic photovoltaic cells. In the case of ohmic conduction the current follows Ohm's law, which states that current flowing through the semiconductor is directly proportional to the potential difference. In the case of space charge limited conduction, however, the current flow is limited by the bulk of the semiconductor, more particularly by the fact that the charge of the charge carriers limits the accumulation of these carriers in the bulk of the semiconductor. In both cases, the charge carrier density in the semiconductor depends only on material parameters. In field-effect transistors, on the other hand, the current flowing between two ohmic contacts, the source and the drain, is modulated by applying a bias to a third contact, the gate electrode. In this way charge carriers can be accumulated or depleted in the semiconductor close to the semiconductor/insulator interface. A small drain bias will then give rise to a current. In addition, the accumulated charges can flood deep traps, such that the mobility of the remaining carriers increases. In these devices the field provides an additional mechanism to control the amount of charges in the semiconductor compared to organic light-emitting diodes and organic photovoltaic cells.

In case of field-effect conduction, an accumulation layer of charge carriers is formed under the influence of an electric field. Charge carriers drift in this accumulation layer over a distance under the influence of the same electric field.

In the different embodiments described herein, the layer comprising one or more organic semiconductor materials in which the different conduction mechanisms take place, together with optional extra organic layers for other purposes (such as e.g. light-emitting layers, electron-blocking layers, hole-blocking layers, transport layers or any other functional layers) is called the active layer.

In embodiments described in the present disclosure, the insulating layer (13, 23, 33, 43, 53, 63 in FIGS. 1 to 8) is patterned and partially covers the first charge injecting electrode (12, 22, 32, 42, 52, 62), being the bottom electrode in FIGS. 1 to 8. So the insulating layer contacts part of the first charge injecting electrode. The insulating layer has an insulator edge (14, 24, 34, 44, 54), being the edge of the insulating layer overlaying the first electrode and formed by the intersection of the plane of the insulating layer top surface, which is the surface not facing the first charge injecting electrode, and the plane of the insulating layer side surface, which is not parallel to the top surface and which results from patterning the insulating layer. The active layer, which may comprise one or more organic semiconductor layers, covers or contacts part of the first charge injecting electrode (12, 22, 32, 42, 52, 62) and at least part of the insulating layer (13, 23, 33, 43, 53, 63). The active layer also contacts the second charge injecting electrode (16, 10, 27, 20, 37, 30, 48, 58, 67), being the top electrode in FIGS. 1 to 8. Thus, the active layer is physically contacting the insulator (13, 23, 33, 43, 53, 63), the first charge injecting electrode (12, 22, 32, 42, 52, 62) and the second charge injecting electrode (16, 10, 27, 20, 37, 30, 48, 58, 67). Material from the active layer may be present in between the insulator and the second charge injecting electrode, however, this is optional. There is no direct contact between the first charge injecting electrode and the second charge injection electrode. At least part of the second charge injecting electrode overlays part of the first charge injecting electrode. The active layer is in electrical contact with both the first charge injecting electrode and the second charge injecting electrode. The second charge injecting electrode (16, 10, 27, 20, 37, 30, 48, 58, 67) is displaced over a predetermined distance with respect to the insulator edge (14, 24, 34, 44, 54) in a direction parallel to the plane of the insulator, such that the second charge injecting electrode is overlaying only part of the insulating layer, said part of the insulating layer not comprising the insulator edge, and such that at least part of the second electrode is overlaying the insulating layer and the remainder of the second electrode is overlaying any electrically insulating layer positioned in between the first charge injecting electrode and the second charge injecting electrode. The predetermined distance over which the second charge injecting electrode is displaced with respect to the insulator edge is at least 100 nm, preferably between 100 nm and 1000 micrometer, more preferably between 1 micrometer and 10 micrometer.

When applying a voltage between the first charge injecting electrode (12, 22, 32, 42, 52, 62) and the second charge injecting electrode (16, 10, 27, 20, 37, 30, 48, 58, 67), charge carriers are injected from these electrodes into the active layer (15; 25,26; 35,36; 45,46,47; 55,56,57; 65). The charge carriers injected from the first electrode should be of a polarity opposite from the polarity of the charge carriers injected from the second electrode. Charge carriers injected by the second charge injecting electrode (16, 10, 27, 20, 37, 30, 48, 58, 67) move by field-effect mobility under the influence of the electric field applied between the two electrodes. Field-effect mobility takes place in an accumulation layer (191 in FIG. 1.c) in the active layer, where charge carriers are accumulated. The position of the two electrodes, in combination with the location of the insulator (13, 23, 33, 43, 53, 63), and the location of the active layer can be chosen such that charge carriers are accumulated at the heterojunction between the insulator and one of the semiconductor layers of the active layer or at the heterojunction between two semiconductor layers of the active layer. The distance over which the charge carriers injected by the second charge injecting electrode move by field-effect mobility is determined by the design of the device, more in particular by the distance over which the second charge injecting electrode is displaced with respect to the insulator edge. As indicated before, this distance is at least 100 nm, such that the charge carriers injected by the second charge injecting electrode are at a distance of at least 100 nm from that electrode before recombining with the other type of charge carriers. When those charge carriers recombine, excitons are created. This way light is emitted at a distance of at least 100 nm from the second charge injecting electrode, thereby limiting optical absorption by the second charge injecting electrode.

Figure 1B:
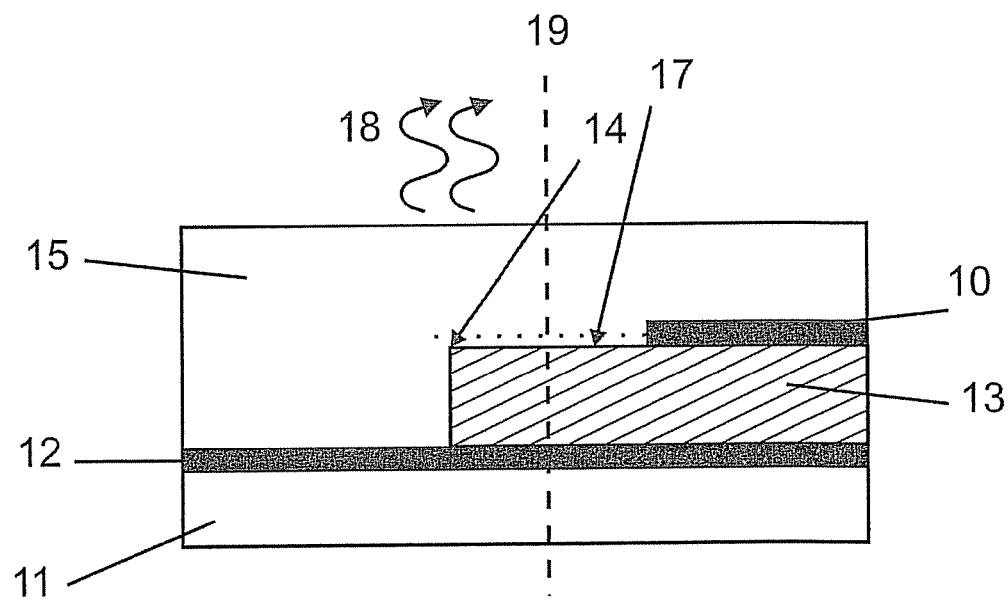
Figure 1C:
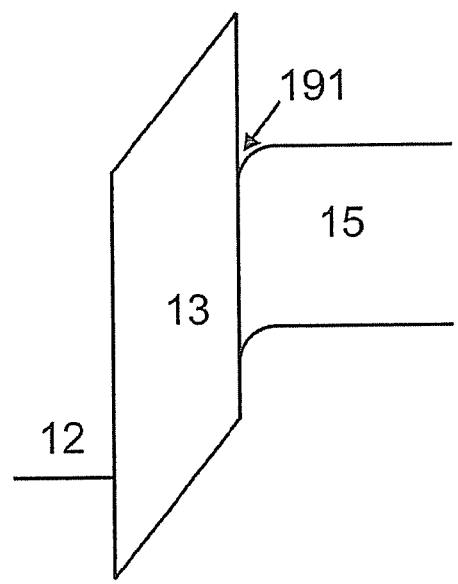

An illustrative cross-sectional view of one embodiment is shown in FIG. 1.a. The device comprises a first charge injecting electrode 12 and a second charge injecting electrode 16, an insulator 13 covering only a part of the first charge injecting electrode 12, the insulator 13 having an insulator edge 14 and at least one organic semiconductor layer 15. This structure may be obtained by depositing an electrically conductive electrode 12 on substrate 11. In embodiments described herein, the term "substrate" may include any underlying material or materials that may be used, or upon which a device may be formed. The substrate may be a rigid substrate or a flexible substrate, and it may be transparent, translucent or opaque. The substrate may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The substrate may include for example an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the substrate may be any other base on which a layer is formed, for example a glass or metal layer. Particularly suitable substrate materials may for example be glass, quartz, sapphire, silicon oxide, capton, Polyethylene terephthalate (PEN), Polyethylene naphthalate (PET), parylene, and polyimide. On top of this first charge injecting electrode 12, an insulator 13 is deposited, covering only part of the electrode area. An organic semiconductor layer 15 overlies the insulator 13 and the first charge injecting electrode 12. A second charge injecting electrode 16 is deposited on top of the organic semiconductor layer 15 above the insulator 13, displaced with respect to the insulator edge 14. In this first configuration, the organic semiconductor layer 15 is deposited first, followed by the second charge injecting electrode 16. In an alternative embodiment, shown in FIG. 1.b, the second charge injecting electrode 10 may be deposited prior to the deposition of the organic semiconductor layer 15.

By applying a bias to the first charge injecting electrode 12, one type of carriers, e.g. negative charge carriers or positive charge carriers, is injected from that electrode 12 into organic semiconductor layer 15 and transported essentially vertically. The corresponding current is expected to be space charge limited or ohmic based. The other type of charge carriers, e.g. positive charge carriers or negative charge carriers, respectively, is injected into the organic semiconductor layer 15 from the second charge injecting electrode (16 or 10) and is accumulating at the interface 17 between the organic semiconductor layer 15 and the insulator 13. These carriers are then laterally transported along the interface 17 between the insulator 13 and the organic semiconductor layer 15 by the electric field between both electrodes 12 and 16 or 10 (field-effect conduction). First charge injecting electrode 12 controls the field-effect conduction of these charge carriers. The mobility of these charge carriers is larger than in a conventional OLED because field-effect mobility is used. Near the insulator edge 14 these carriers form excitons with the oppositely charged, essentially vertically injected carriers from first charge injecting electrode 12. Recombination of the excitons results in light emission 18 in the vicinity of the insulator edge 14 at a large distance from second charge injecting electrode 16 or 10. The first charge injecting electrode 12 may be transparent to light emitted by the device, In the case the device is used for emitting light through the substrate, a transparent substrate such as for example glass or quartz may be used.

In FIGS. 1.a and 1.b, the first charge injecting electrode 12 injects one type of charge carriers. Electrode 12 also attracts the other type of charge carriers injected from second charge injecting electrode 16 (FIG. 1.a) or 10 (FIG. 1.b), thereby forming an accumulation layer at the interface 17 between the insulating layer 13 and the organic semiconductor layer 15. FIG. 1.c shows the potential drop at the cross-section 19, clearly showing the accumulation layer 191 at the interface 17.

Figure 2A:
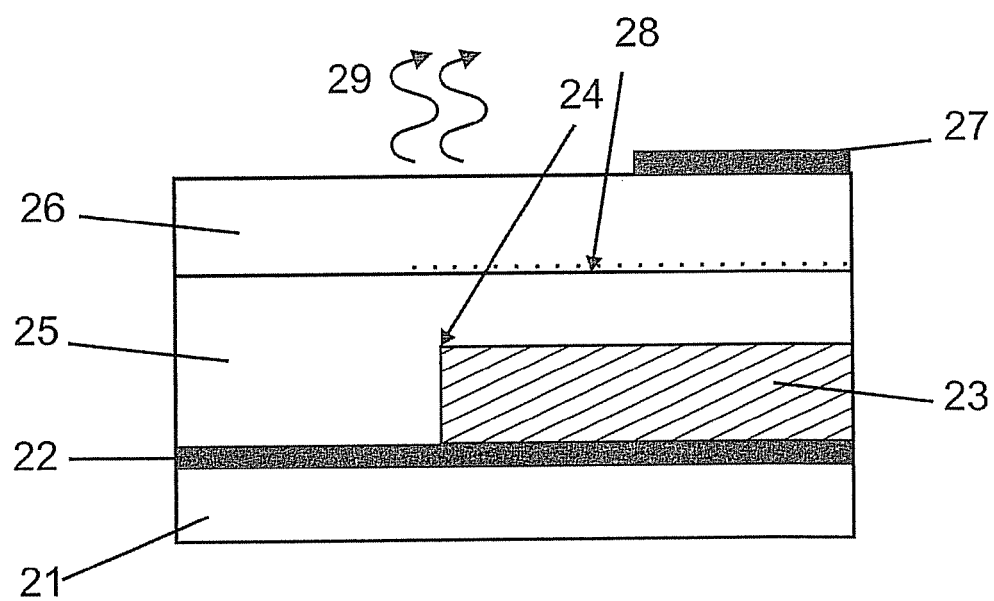
FIG. 2.a is a cross-sectional view of an alternative embodiment of a light-emitting device, wherein 21 is the substrate, 22 is a first charge injecting electrode, 23 is an insulator, 24 is the insulator edge, 25 is a first organic semiconductor layer, 26 is a second organic semiconductor layer, 27 is a second charge injecting electrode, 28 is the interface between first semiconductor layer 25 and second semiconductor layer 26, at which injected charge carriers are accumulating (this is represented by the dots), and 29 is the emitted light.
Figure 2B:
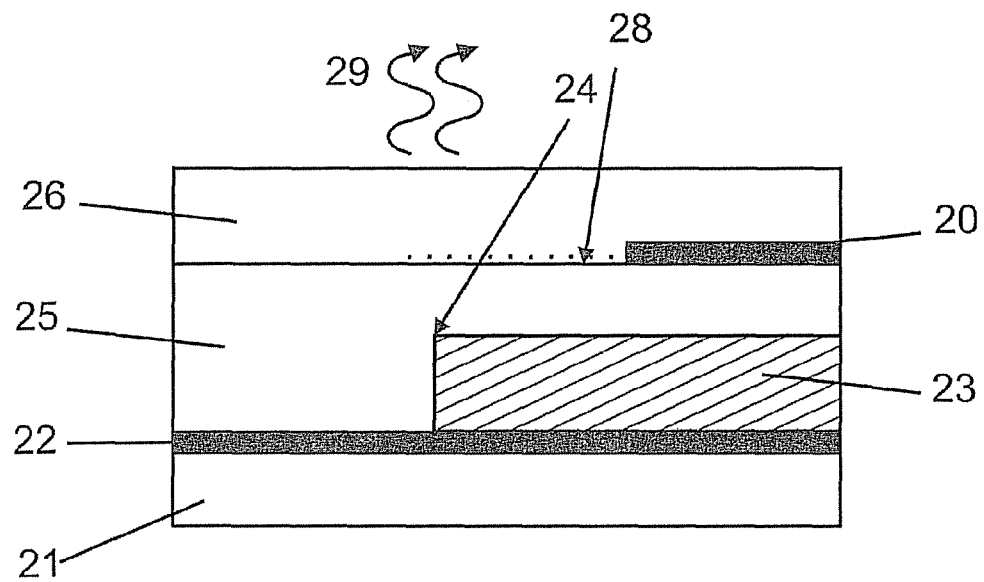

Referring to FIG. 2.a, another embodiment comprises a substrate 21, upon which is deposited a first electrically conductive charge injecting electrode 22. On top of this electrode, an insulator 23 is deposited, covering only a part of the electrode area of the first electrode. A first organic semiconductor layer 25 overlies the insulator 23 and the electrode 22. A second organic semiconductor layer 26 overlies the first organic semiconductor layer 25. Second charge injecting electrode 27 is deposited on top of the second organic semiconductor layer 26 above the insulator 23, displaced with respect to the insulator edge 24 so as to not be located above the insulator edge 24. The first charge injecting electrode 22 injects one type of charge carriers into the first organic semiconductor layer 25 and the second charge injecting electrode 27 injects the other type of charge carriers into the second organic semiconductor layer 26. In such configuration the charge carriers injected from second charge injecting electrode 27 into second organic semiconductor layer 26 accumulate at the interface 28 between the first organic semiconductor layer 25 and the second organic semiconductor layer 26. The first charge injecting electrode 22 controls the accumulation of the charge carriers, injected by the second charge injecting electrode 27, in the second organic semiconductor layer 26 at the interface 28 between the first organic semiconductor layer 25 and the second organic semiconductor layer 26. Electrode 22 may be transparent to light emitted by the device. The light emission 29 occurs near the insulator edge 24. FIG. 2.b is a cross-sectional view of an alternative configuration of the embodiment depicted in FIG. 2.a. In this configuration a second charge injecting electrode 20 is deposited after deposition of the first organic semiconductor layer 25 and prior to the deposition of the second organic semiconductor layer 26.

In this embodiment the first organic semiconductor layer 25 can have two different functions. First, it transports the carriers injected by first charge injecting electrode 22 and second, it forms with second organic semiconductor layer 26 an interface 28, at which accumulation and field-effect transport is taking place.

Figure 3A:
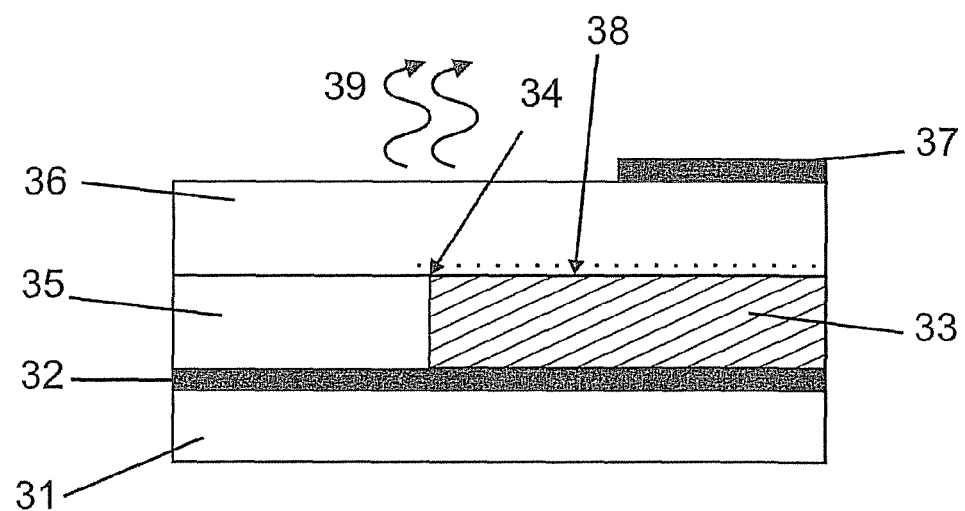
FIG. 3.a is a cross-sectional view of an alternative embodiment of a light-emitting device, wherein 31 is the substrate, 32 is a first charge injecting electrode, 33 is an insulator, 34 is the insulator edge, 35 is a first organic semiconductor layer, 36 is a second organic semiconductor layer, 37 is a second charge injecting electrode, 38 is the interface between insulator 33 and second organic semiconductor layer 36, at which injected charge carriers are accumulating (this is represented by the dots), and 39 is the emitted light.
Figure 3B:
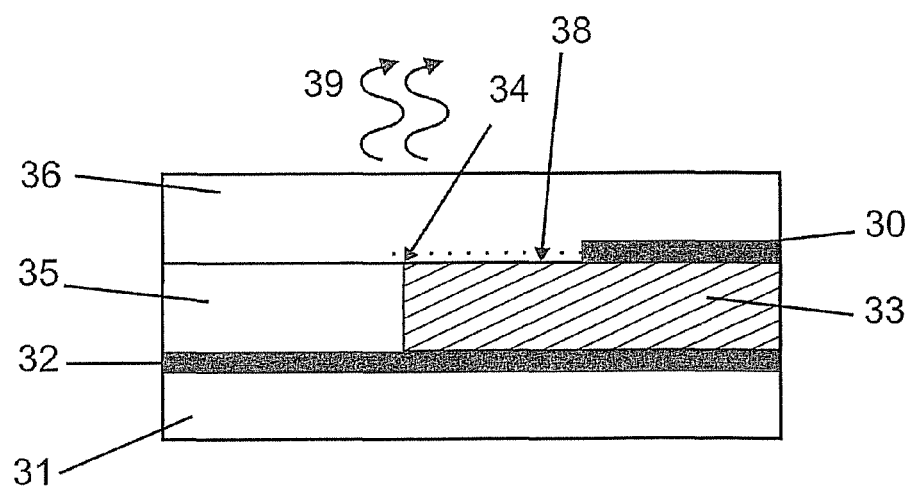

An alternative embodiment is shown in FIG. 3. In this embodiment, two different organic semiconductor layers 35 and 36 are deposited. This embodiment differs from the embodiment illustrated in FIG. 2, in that the first organic semiconductor layer 35 does not overlay the insulator 33, but is confined to a region on top of first charge injecting electrode 32 and adjacent the insulator 33. The second organic semiconductor layer 36, however, overlies both the first organic semiconductor layer 35 and the insulator 33. The device according to this embodiment may be made in different configurations. In a first configuration, the second organic semiconductor layer 36 may be deposited first, followed by second charge injecting electrode 37 being deposited on the second organic semiconductor layer 36. This embodiment is shown in FIG. 3.a. In an alternative embodiment, shown in FIG. 3.b, second charge injecting electrode 30 is deposited on the insulator 33 first, prior to the deposition of the second organic semiconductor layer 36. In both cases, the second charge injecting electrode 37, 30 is offset with respect to the insulator edge 34, i.e. the second charge injecting electrode 37, 30 does not overlay the insulator edge 34. In projection on the top surface of the light generating device, there is a pre-determined distance between the projection of the edge 34 of the insulator 33 and the edge of the second electrode 37, 30, the pre-determined distance being at least 100 nm, preferably between 100 nm and 1000 micrometer, more preferably between 1 micrometer and 10 micrometer. Charge carriers are injected from second charge injecting electrode 37 (FIG. 3.a) or 30 (FIG. 3.b) in the second organic semiconductor layer 36, thereby forming an accumulation layer close to the interface 38 with the insulator 33.

In another embodiment, one or more additional layers (46 in FIG. 4 and 56 in FIG. 5) may be added between the first organic semiconductor layer (45, 55) and the second organic semiconductor layer (47, 57). These one or more additional layers may be light-emitting layers, electron-blocking layers (such as polytrialene amine (PTAA)), hole-blocking layers (such as 2,9-Dimethyl-4,7-diphenyl-1,10-phenanthroline (BCP)) or transport layers (such as trishydroxyquinoline aluminium (Alq3), NN'-Ditridecylperylene-3,4,9,10 tetracarboxylic diimide (PTCDI-C13H27), N,N'-Bis-(3-methylphenyl)-N,N'-bis-(phenyl)-benzidine (TPD)). These layers may be confined to a certain predetermined region, e.g. a region adjacent the insulator (as layer 46 in FIG. 4) or may cover the whole sample (as layer 56 in FIG. 5). These additional layers may be any suitable layers for use in an organic light generating device, for example polymers, small molecules or metal complexes.

Figure 4:
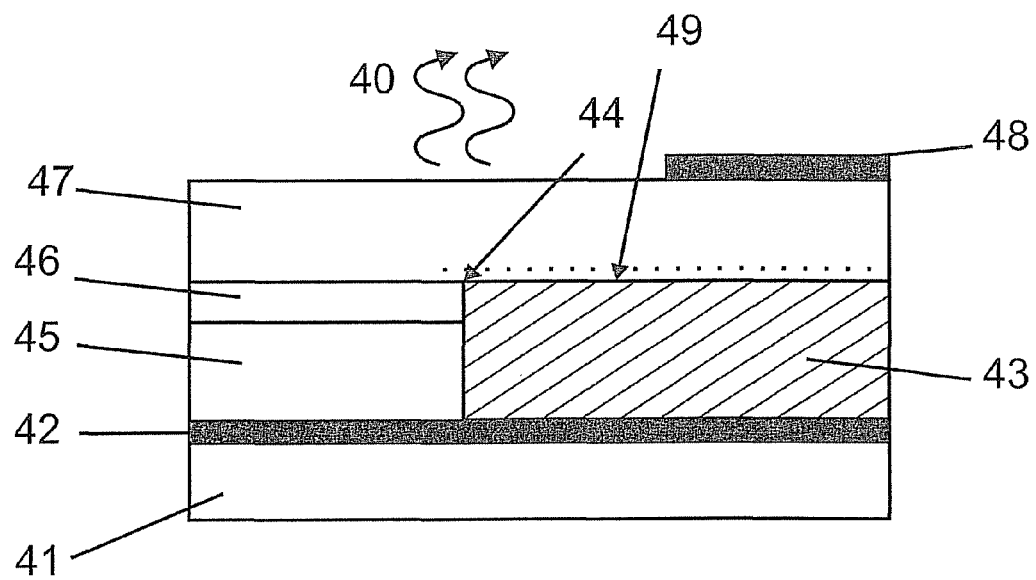
FIG. 4 is a cross-sectional view of an alternative embodiment of a light-emitting device in accordance with embodiments described in the present disclosure, wherein 41 is the substrate, 42 is a first charge injecting electrode, 43 is an insulator, 44 is the insulator edge, 45 is a first organic semiconductor layer, 47 is a second organic semiconductor layer, 46 is a third organic layer, 48 is a second charge injecting electrode, 49 is the interface between the third organic layer 46 and the insulator 43, at which injected charge carriers are accumulating (this is represented by the dots), and 40 is the emitted light.

The device of FIG. 4 comprises a substrate 41, upon which is deposited a first electrically conductive charge injecting electrode 42. On top of this electrode 42, an insulator 43 is deposited, covering only a part of the electrode area. A first organic semiconductor layer 45 is then deposited, covering part of the first charge injecting electrode 42 adjacent the insulator 43, without overlaying the insulator 43. On top of this first organic semiconductor layer 45, an additional layer 46 is deposited. This additional layer 46 covers only the region on top of the first organic semiconductor layer 45, without overlaying the insulator 43. Layer 46 may be a combination or stack of different layers or may be a single layer. This additional layer 46 may for example be a light-emitting layer. A second organic semiconductor layer 47 overlies this additional layer 46 and the insulator 43. The second charge injecting electrode 48 is deposited on top of the second organic semiconductor layer 47 above the insulator 43, displaced with respect to the insulator edge 44. If layer 46 is a light-emitting layer, when applying a bias on the first charge injecting electrode 42, one type of charge carriers is injected from first charge injecting electrode 42 into the first organic semiconductor layer 45 and transported essentially vertically to the light-emitting layer 46. The other type of charge carriers is injected from second charge injecting electrode 48 and transported laterally, by field-effect conduction, towards the insulator edge 44, where they can be injected into the light-emitting layer 46. The two types of charge carriers recombine in the light-emitting layer 46 and generate light emission 40 near the insulator edge 44 in the light-emitting material. As mentioned before, this example is not limitative. There may be more than one additional layer 46 and one or more of these layers may cover the complete sample.

Figure 5:
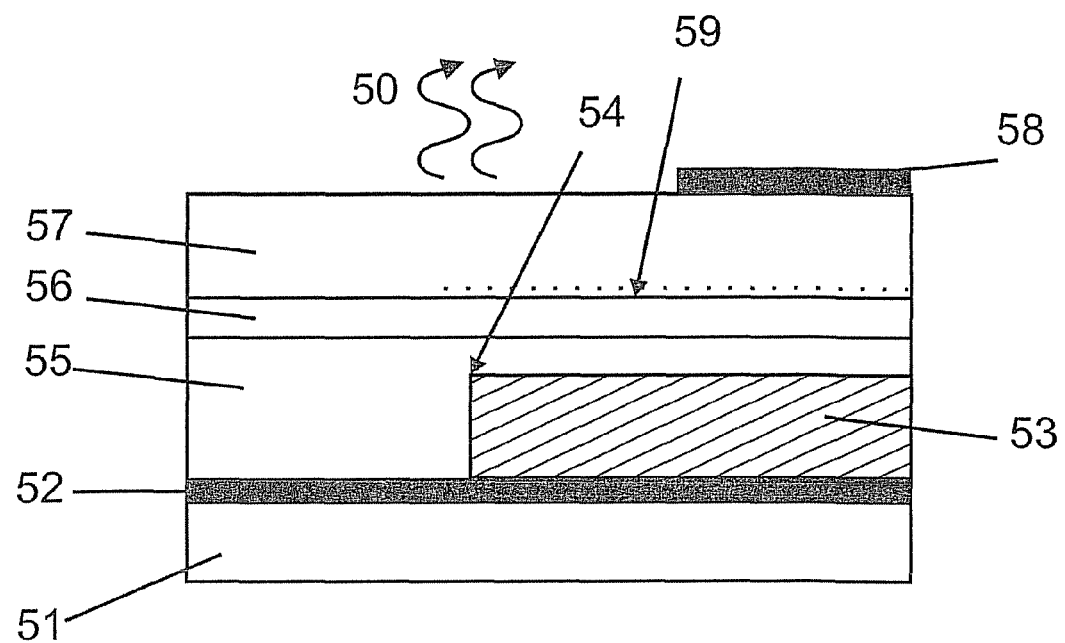
FIG. 5 is a cross-sectional view of a purely illustrative example of another alternative embodiment of a light-emitting device in accordance with embodiments described in the present disclosure, wherein 51 is a substrate, 52 is a first charge injecting electrode, 53 is an insulator, 54 is the insulator edge, 55 is a first organic semiconductor layer, 57 is a second organic semiconductor layer, 56 is a third organic layer, 58 is a second charge injecting electrode, 59 is the interface between the second organic semiconductor layer 57 and the third organic layer 56, at which injected charge carriers are accumulating (this is represented by the dots), and 50 is the emitted light.

FIG. 5 shows an embodiment wherein the first organic semiconductor layer 55 covers both the first charge injecting electrode 52 and the insulator 53 and the additional layer 56 fully covers the first organic semiconductor layer 55. On top of substrate 51, an electrically conductive electrode 52 is deposited. On top of this first charge injecting electrode 52, an insulator 53 is deposited, covering only a pre-determined part of the electrode area. A first organic semiconductor layer 55 is deposited covering both the first charge injecting electrode 52 and the insulator 53. On top of this first organic semiconductor layer 55, an additional layer 56 is deposited. Layer 56 may be a combination or stack of different layers or may be a single layer. This additional layer 56 may be a light-emitting layer. A second organic semiconductor layer 57 overlies this additional layer 56. A second charge injecting electrode 58 is deposited on top of the second organic semiconductor layer 57 above the insulator 53, displaced with respect to the insulator edge 54 and not overlaying the insulator edge 54.

It should be understood that the embodiments above are only a limited selection of all possible embodiments. Many other combinations and locations of semiconductor layers, additional layers, insulating layer and first and second charge injecting electrode are possible.

Figure 6A:
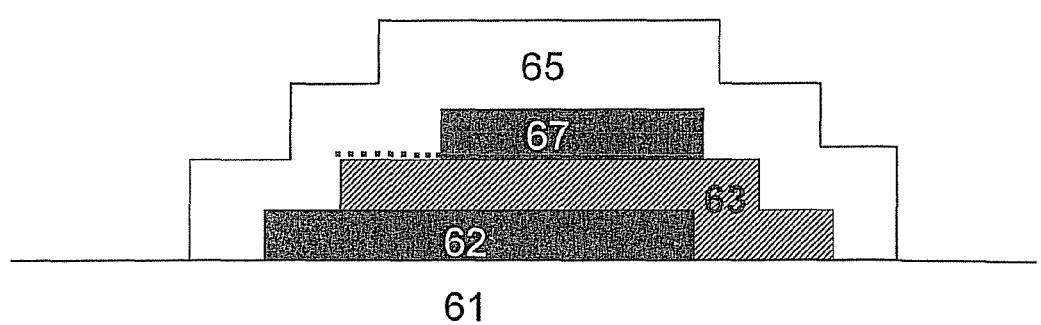
FIG. 6.a to 6.c are cross-sectional views illustrating different locations of the second charge injecting electrode 67. On a substrate 61, a first charge injecting electrode 62 is deposited, followed by the deposition of an insulating layer 63. The active layer in which the conduction takes place is represented by 65. The accumulation layer of charge carriers (191 in FIG. 1.c) is indicated by the dots. The second charge injecting electrode 67 is in contact with this active layer.
Figure 6B:
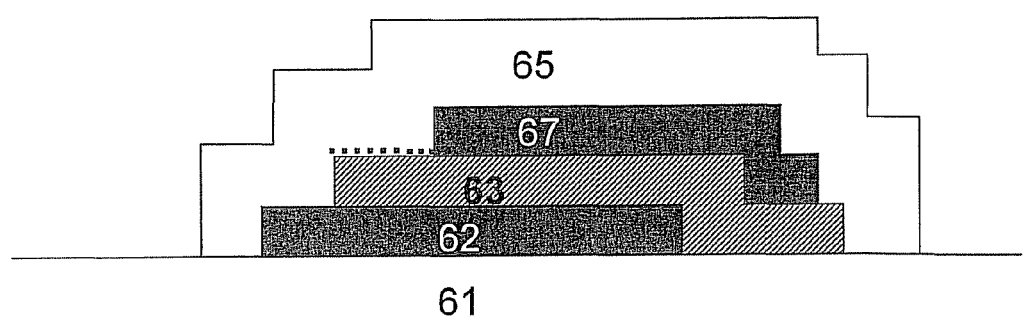
Figure 6C:
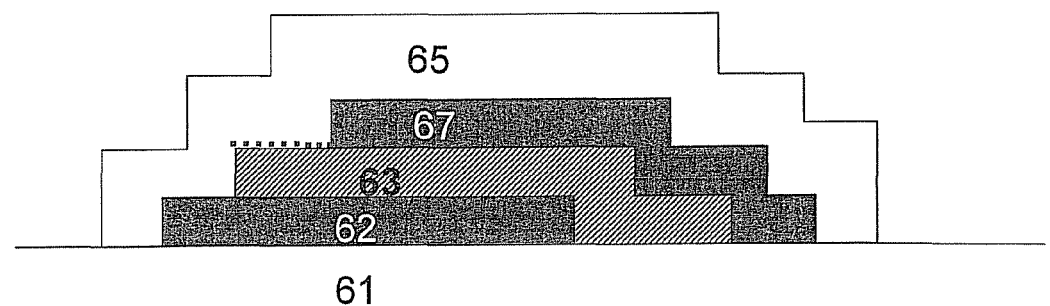
Figure 7A:
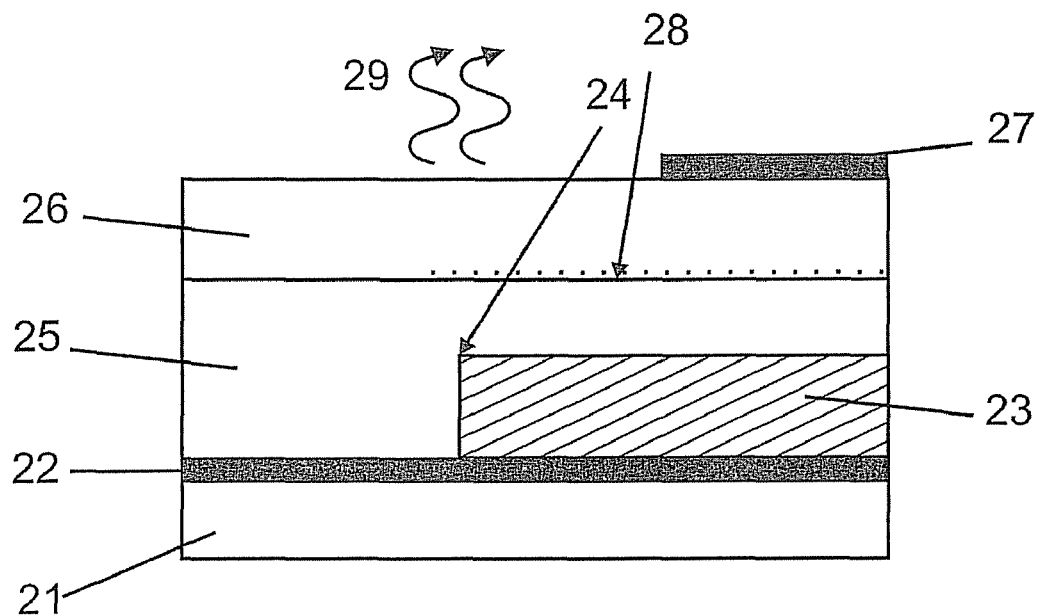
FIG. 7 teaches possible alternatives for the geometrical layout of the electrodes.
Figure 7B:
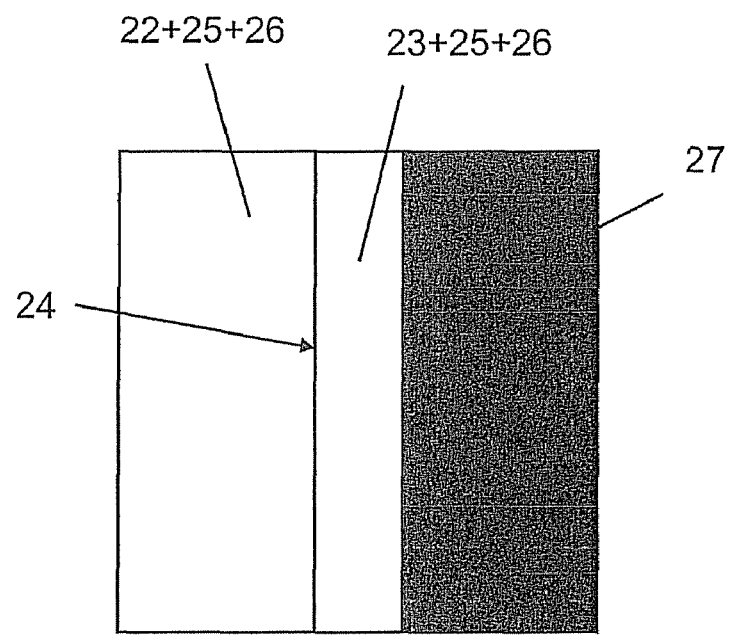
Figure 7C:
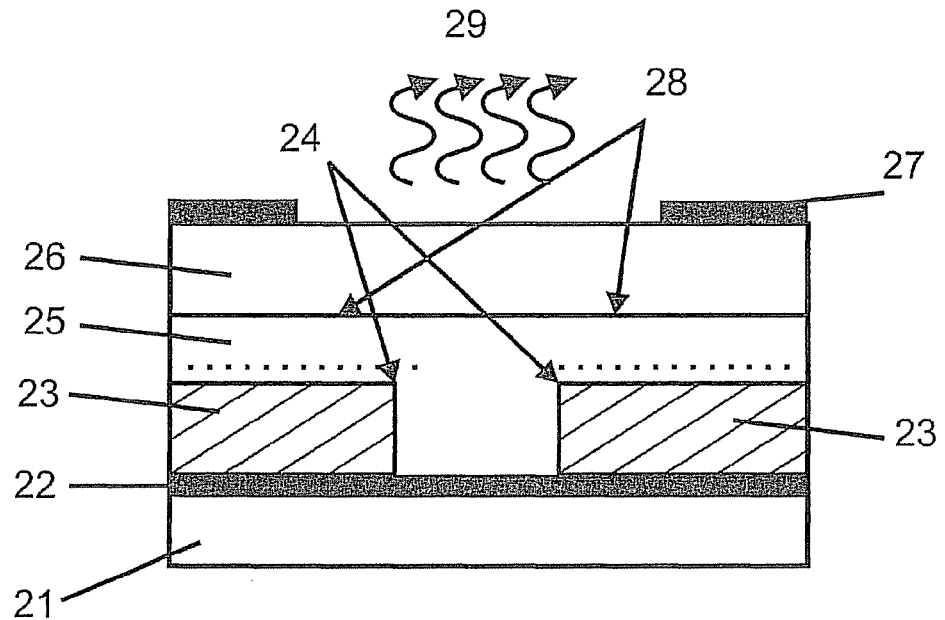
Figure 7D:
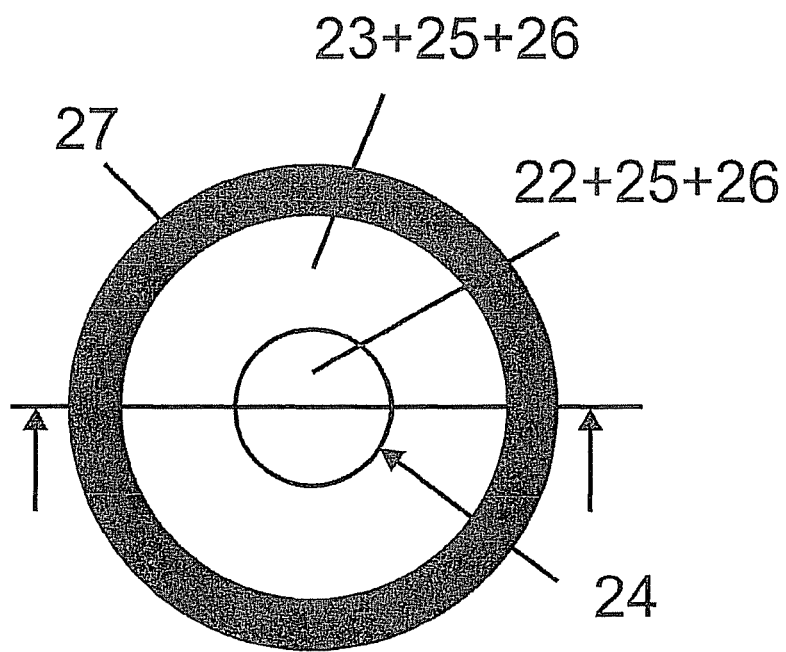
Figure 8:
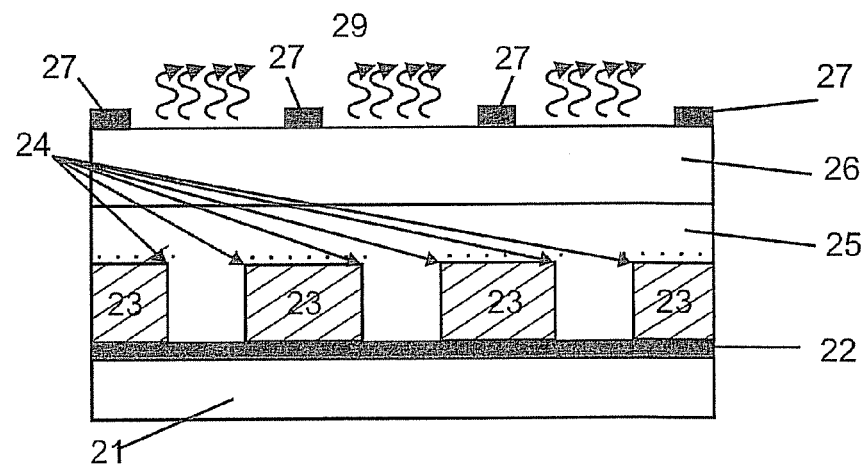
FIG. 8 is a cross-sectional view of the embodiment shown in FIG. 2, represented in a repetitive configuration.

FIG. 6 is a cross-sectional view illustrating different locations of the second charge injecting electrode 67. On a substrate 61, a first charge injecting electrode 62 is deposited, followed by the deposition of an insulating layer 63. The active layer in which the conduction takes place is represented by 65. The second charge injecting electrode 67 is in contact with this active layer. The accumulation layer of charge carriers (191 in FIG. 1.c) is indicated by the dots. The first charge injecting electrode 62 and the second charge injecting electrode 67 should not be in electrical contact, meaning that there should not be a short-circuit between those two electrodes. This means that, in case of an electrically insulating substrate, both electrodes may contact or touch the underlying substrate. This is illustrated in FIG. 6.c.

The embodiments described above, as well as all other embodiments may be made with different geometries. In FIG. 7 different geometries for the embodiment depicted in FIG. 2 are represented. In a first geometrical configuration, the device is essentially rectangular in projection onto the substrate, which means that the insulator edge is a straight line. The embodiment represented in FIG. 2 is shown in a rectangular configuration in FIGS. 7.a and 7.b. In an alternative embodiment, the device is circular in projection onto the substrate. In this configuration, a circular hole is made in the insulator. The second charge injecting electrode 27 forms a ring structure and is deposited essentially concentrically on top of the hole in the insulator. The circular configuration of the embodiment represented in FIG. 2 is shown in FIGS. 7.c and 7.d. This example is not intended to be restrictive. The different embodiments can be made in the geometrical configurations described above as well as in other geometrical configurations.

The embodiments described above, as well as all other embodiments may be repeated several times in one device. As an example the embodiment represented in FIG. 2 is illustrated in a repetitive configuration in FIG. 8. This example is not intended to be restrictive; all different embodiments may be made in a repetitive configuration.

In the different embodiments, the insulating layer (13, 23, 33, 43, 53, 63 in FIGS. 1 to 8), is preferably a silicon dioxide layer with a thickness between 1 nanometer and 1 micrometer, typically 100 nanometer. Also other oxides, such as aluminumoxide, tantalum pentoxide, hafnium oxide, ect., polymer dielectrics such as BCB, polyimide, poly vinyl phenol, polystyrene, poly vinyl alcohol, etc., and other dielectrics such as self assembled monolayers, low k dielectrics, high k dielectrics, ferro-electric insulators, etc. can be chosen as insulator.

The injection of electrons and holes is important for the functioning of the device. Injection of charge carriers can be facilitated by the use of an appropriate material for the electrodes, meaning a material that has a low barrier against injection of a charge carrier type in the specific organic layer. Examples of materials that can be used to fabricate the charge injecting electrodes are Au, Ca, Mg, LiF:Al, Al, In, C, Perovskite Manganites (Re1-xAxMnO3), indium-tin-oxide, titanium oxide, zinc oxide, Cr, Cu, Fe, Ag, poly(3,4-ethylenedioxythiophene) combined with poly(styrene sulfonate), and inks and nanoparticle solutions based on these materials.

In an embodiment, the second charge injecting electrode (16, 10, 27, 20, 37, 30, 48, 58, 67) may be a metal. In the preferred embodiment, the parasitic light absorption by the second charge injecting electrode is reduced as compared to the case of existing OLEDs, because the recombination of the charge carriers results in light emission near the insulator edge (14, 24, 34, 44, 54), at a predetermined distance from the light-absorbing second electrode (16, 10, 27, 20, 37, 30, 48, 58, 67), this distance being larger than in existing OLEDs. This is obtained by depositing the second charge injecting electrode (16, 10, 27, 20, 37, 30, 48, 58, 67) above the insulator (13, 23, 33, 43, 53, 63), displaced with respect to the insulator edge (14, 24, 34, 44, 54). The larger the distance between the second charge injecting electrode and the insulator edge, the larger the distance between the light-absorbing top electrode and the point where the light-emission occurs and the lower the optical absorption losses in the second charge injecting electrode. However, increasing this distance also leads to a smaller amount of charges that can reach the insulator edge, resulting in less light emission and a lower current. Therefore, the distance between the insulator edge (14, 24, 34, 44, 54), in the vicinity of which generation of excitons occurs, and the second charge injecting electrode (16, 10, 27, 20, 37, 30, 48, 58, 67), e.g. metallic electrode, may be optimized to obtain the highest current density and lowest optical losses. To avoid optical absorption, the distance between the insulator edge and the metallic second charge injecting electrode is preferably larger than the wavelength of the emitted photons. This means that the distance between the insulator edge and the metallic second charge injecting electrode should preferably be larger than 100 nm. Therefore the second charge injecting top electrode should preferably be deposited at a distance between 100 nm and 1000 μm from the insulator edge, typically at a distance between 1 μm and 10 μm.

In order to reduce absorption losses in the first charge injecting electrode (12, 22, 32, 42, 52, 62), in a preferred embodiment the first charge injecting electrode is transparent to the light emitted by the device. A transparent conductive material formed by a transparent conductive oxide such as indium-tin-oxide, zinc oxide, titanium oxide may be used or a conductive polymer, such as polyethylenedioxythiophene: polystyrenesulfonate (Pedot:PSS). The optical absorption of such materials is small compared to the optical absorption of a metal.

The embodiments in the present disclosure each comprise at least one organic semiconductor layer. In FIG. 1 a device with one organic semiconductor layer 15 is illustrated. In FIGS. 2 to 8, devices with two or more organic semiconductor layers (25 and 26, 35 and 36, 45 and 46 and 47, 55 and 56 and 57) are shown. The organic semiconductor layers may comprise small molecules (these are molecules with a molecular mass between 2 and 10,000), such as tetracene, pentacene, perylenes, oligothiophens (terthiophenes, tetrathiophene, quinquethiophene or sexithiophene), bora-diazaindacene fluorophores, trishydroxyquinoline aluminium (Alq3), tetraphenyldiamine, etc.; the organic semiconductor layers may comprise polymers, such as polyphenylenenvinylene, polyfluorene, polytrialeneamine or polythiophene; they may comprise metal complexes such as Pt-octaethylporphyring. The list of materials is not intended to be restrictive, but only to provide examples.

Deposition of small molecules is typically done by sublimation or vapor-phase transport. Polymers, on the other hand, may be deposited by different techniques, such as spin coating, drop casting, inkjet printing, doctor blading, etc. It may be advantageous to use a solution-processed material as first organic semiconductor layer and an evaporated material as second organic semiconductor layer. Solution-processed layers often result in a smooth top surface, which is advantageous for the growth of an additional layer by vacuum deposition. Referring to FIG. 7.d, inkjet printing may be used for depositing a drop in the center of the structure.

Because charge carriers injected from the second charge injecting electrode (16, 10, 27, 20, 37, 30, 48, 58, 67) have to travel over a distance of at least 100 nm (between 100 nm and 1000 µm, typically between 1 µm and 10 µm) in the organic semiconductor layer underneath (15, 26, 36, 47, 57), preferably organic materials having a high mobility should be used for this organic semiconductor layer. Examples of materials having a high mobility are NN'-Ditridecylperylene-3,4,9,10 tetracarboxylic diimide (PTCDI-C13H27), pentacene, tetracene, Phthalocyanines (e.g. CuPc, F16Pc), fullerene, polytrialene amine (PTAA), P3HT etc. This list of materials is not intended to be restrictive, but only to provide examples.

When two or more organic semiconductor layers are combined (as illustrated in FIGS. 2 to 5, 7 and 8), different combinations of organic semiconductor materials mentioned above are possible (layers with numbers 25 and 26, 35 and 36, 45 and 47, 55 and 57 in the different Figures). For example, the first organic semiconductor layer (25, 35, 45, 55) may be a polymer layer and the second organic semiconductor layer (26, 36, 47, 57) may comprise or consist of small molecules. As used herein, small molecules are considered to be molecules with a molecular mass between 2 and 10.000. In that case, the bottom polymer layer (25, 35, 45, 55) is deposited first. An advantage is that a polymer layer may be deposited by spincoating, which results in a smoother surface than in the case of deposition techniques typically used for small molecules. The smoothness of the top surface of the polymer layer may improve the growth of an additional layer. The typical low mobility of a polymer is not a limiting factor, because the carriers only have to be transported over a small vertical distance. On top of the polymer layer, organic small molecules are then deposited. At least two advantages can be found for this approach. First, organic small molecules typically have a higher mobility compared to polymers. Therefore, lateral transport over a longer distance is possible. Second, it was found that small molecules grow in very well ordered films on top of a polymer film, maintaining their high mobility. The combination of polymers and small molecules is not essential for the working of the device, but it greatly improves the performance.

In another embodiment the first organic semiconductor layer (25, 35, 45, 55) and the second organic semiconductor layer (26, 36, 47, 57) may comprise or consist of small molecules.

In another embodiment the first organic semiconductor layer (25, 35, 45, 55) and the second organic semiconductor layer (26, 36, 47, 57) may comprise polymers. In this case the solvents of the polymers must be carefully chosen, preferably from classes of orthogonal solvents, such that the first polymer layer is not dissolved by the solvent of the second polymer layer. Examples of orthogonal solvents are water and toluene, alcohol and chlorobenzene.

The accumulation layer of the charge carriers is formed at the heterojunction between the insulating layer and one of the organic semiconductor layers or at the heterojunction between two organic semiconductor layers. So the charge carriers are formed at the junction of two different materials adjacent to each other; those materials may be the insulating layer and one of the organic semiconductor layers or they may be two different organic semiconductor layers.

The first organic semiconductor layer (25, 35, 45, 55) may be a p-type layer and the second organic semiconductor layer (26, 36, 47, 57) may be an n-type layer. In this case, the first charge injecting electrode (22, 32, 42, 52) injects holes into the first organic semiconductor layer and the second charge injecting electrode (27, 20, 37, 30, 48, 58) injects electrons into the second organic semiconductor layer.

In another embodiment the first organic semiconductor layer (25, 35, 45, 55) may be an n-type layer and the second organic semiconductor layer (26, 36, 47, 57) may be a p-type layer. In this case, the first charge injecting electrode (22, 32, 42, 52) injects electrons into the first organic semiconductor layer and the second charge injecting electrode (27, 20, 37, 30, 48, 58) injects holes into the second organic semiconductor layer.

In another embodiment one or more organic layers are partially or fully doped. Examples of dopants are I, Fe3Cl, F4-TCNQ, Ca, PSS, molecules different from the material used in the organic layer. This list of dopants is not intended to be restrictive, but only to provide examples.

Other embodiments combine two or more embodiments. For example, one or more additional layers may be added and one or more of the organic layers may be partially or fully doped.

Typical thickness of the organic semiconductor layers is between 1 nanometer and 10 micrometer. The preferred thickness is between 30 nanometer and 100 nanometer.

In some cases, the organic semiconductor layer needs to be limited to a certain area, as illustrated in FIG. 3 (layer 35) and in FIG. 4 (layers 45 and 46). There are different possibilities to confine the organic semiconductor layer such as inkjet printing, screen-printing, etc.

These devices operate by applying a bias voltage between the two electrodes. This bias voltage may be a continuous voltage or it may be a pulsed voltage.

Using such embodiments in combination with a pulsed voltage, the triplet density in the device may be reduced. Generally, there exist mainly two different types of excitons: triplet excitons or triplets and singlet excitons or singlets. The lifetime of triplets is larger than that of singlet excitons. Typical lifetime of the triplets is between 100 nanoseconds and 1 second, whereas the lifetime of singlets is typically shorter than 10 nanoseconds. Under electrical excitation, typically more triplets than singlets are generated. In combination with the long triplet lifetime, this results in a very large triplet density as compared to the singlet density. These triplets may severely quench the singlets. However, when the devices disclosed herein operate by applying a pulsed voltage between the two electrodes, the triplet density may be controlled and quenching of singlets by triplets may be reduced. In order to control the triplet density in the device the pulses should be optimized.

Figure 12A:
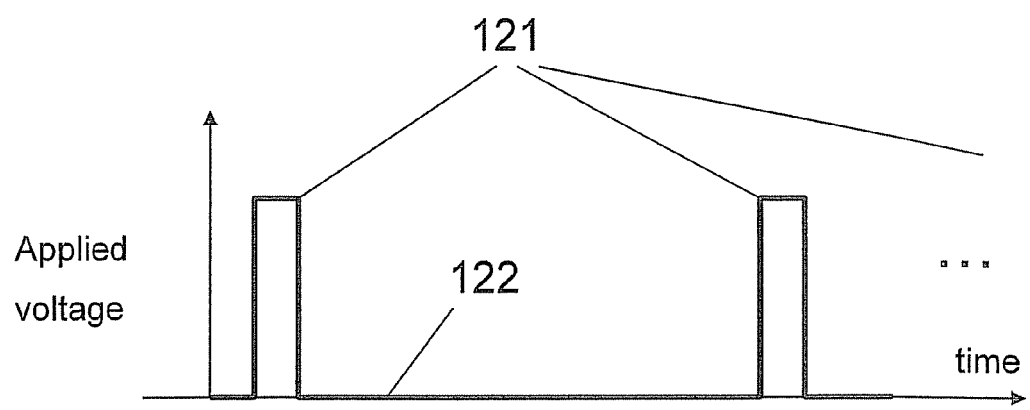
FIG. 12 shows typical electrical bias schemes for pulsed operation of a light-emitting device.
Figure 12B:
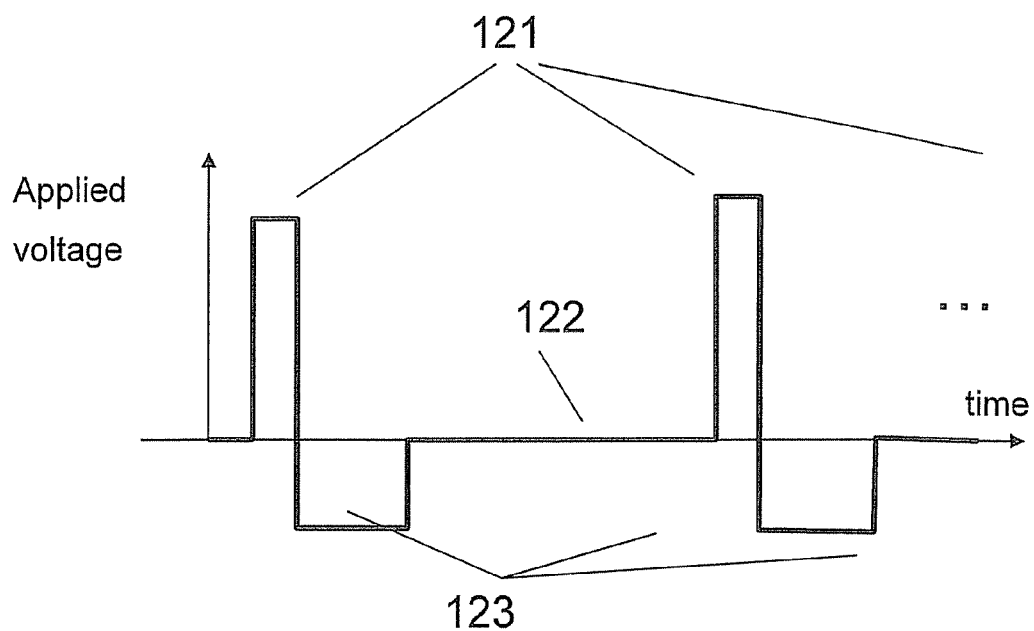

Typical pulsed bias schemes are shown in FIG. 12.*a* and FIG. 12.*b*. 121 indicates a pulse with a bias condition (applied voltage) at which charges are injected into the active layer of the device. The duration of these pulses is preferably chosen to be longer than the radiation lifetime of singlet excitons (typically 1 ns) but shorter than the lifetime of triplet excitons. The duration of the interval 122 between pulses is preferably chosen to be longer than the lifetime of triplet excitons. Optionally, as shown in FIG. 12.*b*, an extra pulse 123 may be applied during the interval 122, in order to extract a substantial amount of at least one type of charge carriers from the active layer of the device.

Pulsed operation as illustrated in FIG. 12 may also be used to reduce heating of the device. Only during pulses 121 power is dissipated in the device, and the interval 122 may be used to dissipate heat without adding power.

The devices may operate at room temperature. Alternatively, they may operate in the temperature range from 1 Kelvin to 450 Kelvin.

In a further improvement of the device, optical confinement layers may be added to the device structure, below and/or above the light emitting layer. Preferred means of optical confinement comprise a structure of materials with lower refractive index than that of the light-emission zone, to provide optical confinement by waveguiding. Optical feedback structures may be provided, such as reflectors, distributed Bragg reflectors, distributed feedback structures or metal mirrors. The integration of optical elements such as lenses is also possible.

Figure 11A:
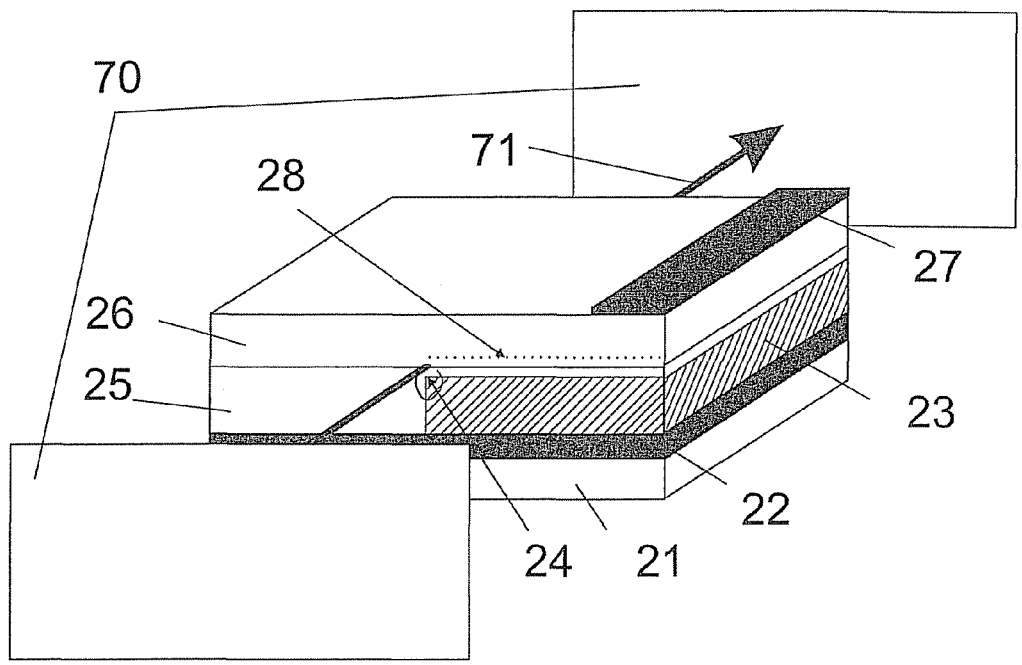
FIG. 11 teaches possible alternatives for the incorporation of optical resonators.
Figure 11B:
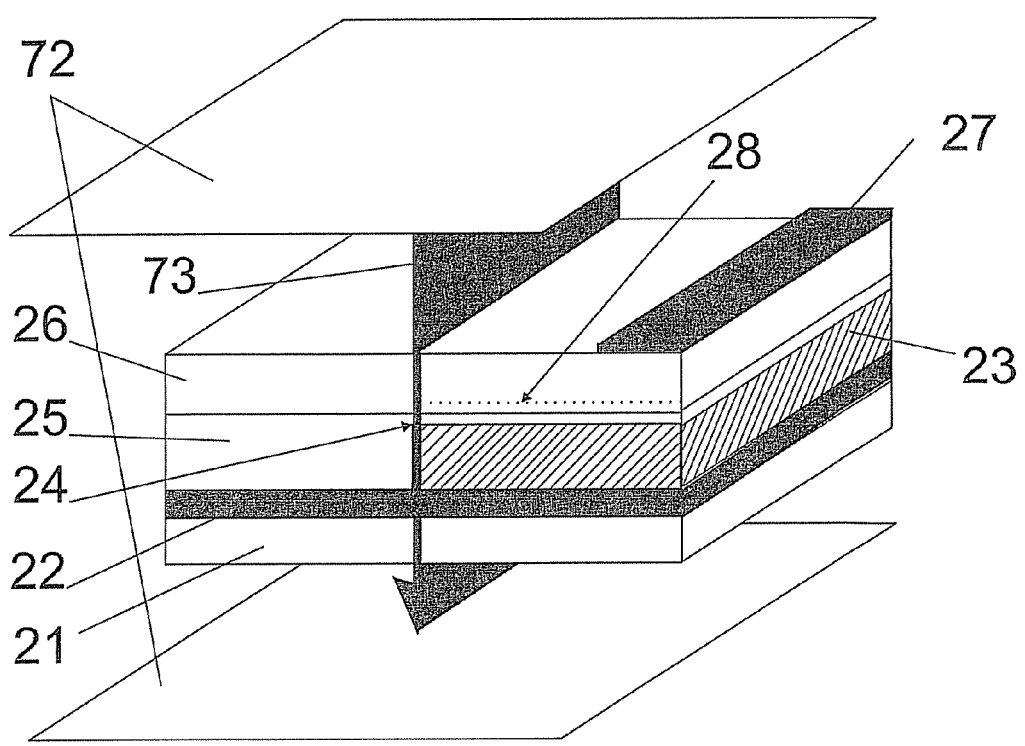

Depending on the materials and on the optical confinement layers, light may be emitted isotropically or in specific directions. The light output may be incoherent. When using suitable organic semiconductors, optical confinement structures and efficient optical feedback structures or resonators, the light output may also be coherent and laser emission may be achieved. This is illustrated in FIG. 11, showing possible alternatives for the incorporation of optical resonators. In FIG. 11.*a*, resonators 70 are positioned around a light generating device (in the example illustrated a light generating device corresponding to the embodiment shown in FIG. 2) in such a way that feedback is generated in the lateral direction. Arrow 71 indicates the direction in which feedback is generated. In FIG. 11.*b*, resonators 72 are positioned around a light generating device (in the example illustrated a light generating device corresponding to the embodiment shown in FIG. 2) in such a way that feedback is generated in the vertical direction, as indicated by arrow 73.

The devices described herein may be used in nanoscale light sources for nano-photonics and nano-optoelectronics, laser applications, displays and automotive illuminations. The potential for applications, in particular for intense light generation sources such as organic lasers, arises from the specific device geometry and working mechanism, which allows reduction of optical absorption losses, maintaining high current densities and therefore high light intensities. The list of applications is not intended to be restrictive, but only to provide examples.

Referring to FIG. 2, in a preferred embodiment, the first organic semiconductor layer 25 may be a p-type layer and the second organic semiconductor layer 26 may be an n-type layer. In this case, the first charge injecting electrode 22 injects holes into the first organic semiconductor layer 25 and the second charge injecting electrode 27 injects electrons into the second organic semiconductor layer 26. Preferably first charge injecting electrode 22 is an indium-tin-oxide electrode, which is transparent and has low optical absorption losses. Injection into the n-type organic semiconductor layer 26 may happen from a LiF:Al electrode. In the preferred embodiment, the first organic semiconductor layer 25 may be a polymer layer and the second organic semiconductor layer 26 may consist of small molecules. Preferably an n-type material with high electron mobility may be used, to enhance efficient lateral field-effect transport. The use of a polymer for the first organic semiconductor layer 25 and a small molecule for the second organic semiconductor layer 26 is one particular well-chosen combination in this device. The polymer layer may be deposited first. This has the advantage that the top surface is very smooth, improving the growth of an additional layer. The typical low mobility of a polymer is not a limiting factor, because the carriers only have to be transported over a small vertical distance. On top of the polymer layer organic small molecules may then be deposited. This has two main advantages. First, organic small molecules typically have a higher mobility compared to polymers. Therefore, lateral field-effect transport over a longer distance is possible. Secondly, it was found that small molecules grow in well-ordered films on top of a polymer film, maintaining their high mobility. The combination of polymers and small molecules is not essential for the working of the device, but it greatly improves the performance.

As a purely illustrative example of this embodiment, the device represented in FIG. 5 was made. This device comprises a glass substrate 51, covered with a transparent indium-tin-oxide electrode layer 52. On top of this first charge injecting electrode 52, a silicon dioxide layer 53 is deposited, only partly covering the electrode area. In a next step of a process for manufacturing such a device, a p-type organic semiconductor polymer layer 55, polytrialene amine (PTAA), is spin-coated over the complete sample, followed by the deposition of an organic layer doped with Iridium (III) bis(2-(2'-benzothienyl)pyridinato-N,$C^3$)(acetylacetonate) (btp2Ir(acac)) as light-emitting dye 56. Next, a layer 57 comprising NN'-Ditridecylperylene-3,4,9,10 tetracarboxylic diimide (PTCDI-C13H27), an n-type small molecule, is deposited. Here, PTCDI-C13H27 is used as n-type material because this material possesses high electron mobility, which is preferred for efficient lateral transport. Finally, a LIF:Al top electrode layer 58 is vacuum deposited by metal evaporation through a shadow mask, displaced with respect to the insulator edge 54.

Figure 9:
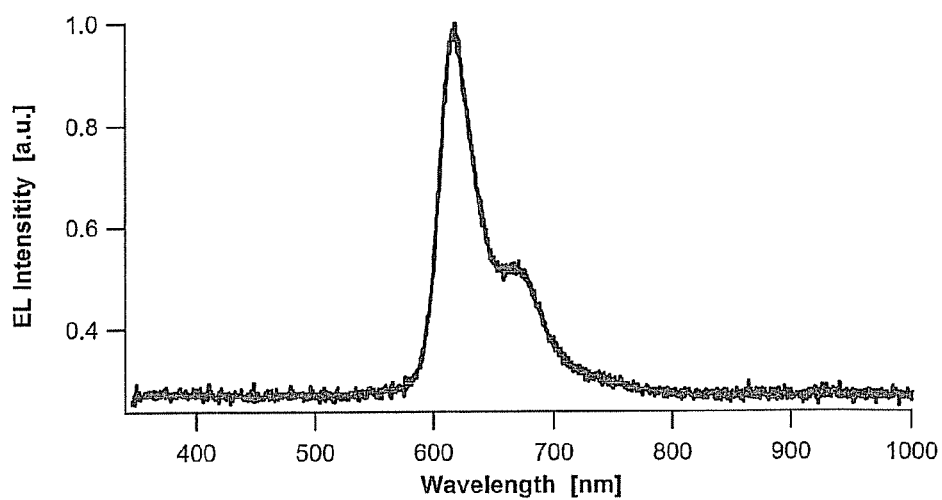
FIG. 9 is a graph showing the measured light emission spectrum of the device of FIG. 5, when a positive voltage is applied to the first charge injecting electrode 52 with respect to the second charge injecting electrode 58 and wherein the following materials are used: the first charge injecting electrode 52 is indium-tin-oxide, the insulator 53 is made of silicon dioxide, the first organic semiconductor layer 55 is PTAA, the second organic semiconductor layer 57 is PTCDI-C13H27, the third organic layer 56 is a polymer layer doped with btp2Ir(acac) as light-emitting dye, and the second charge injecting electrode 58 is made of LiF:Al.
Figure 10:
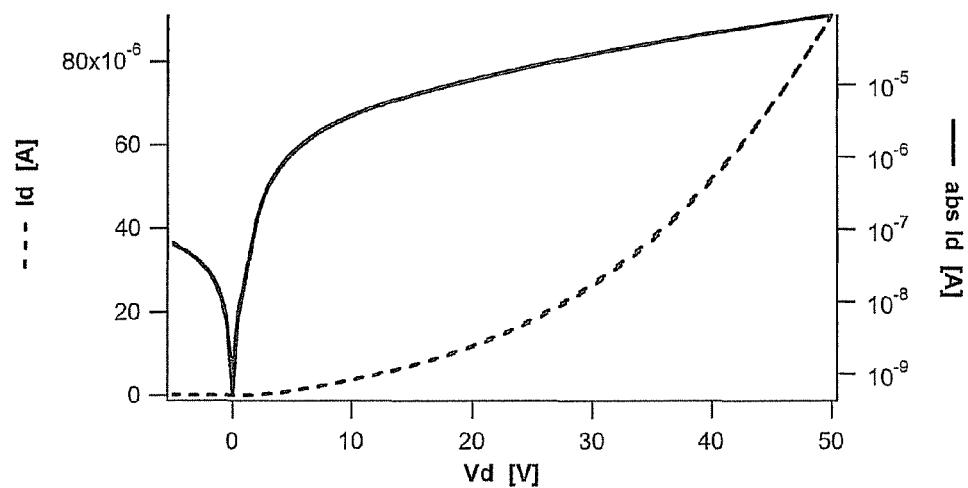
FIG. 10 is a graph illustrating the measured current flowing between the first charge injecting electrode 52 and the second charge injecting electrode 58 as a function of the voltage applied between these electrodes.

By applying a positive voltage bias to the indium-tin-oxide electrode (52), holes are injected from that electrode into the PTAA layer 55 and electrons are injected from second electrode 58 into the PTCDI-C13H27 layer 57. The holes are transported essentially vertically by space charge limited conduction or ohmic conduction. The electrons are forming an accumulation layer in the PTCDI-C13H27 layer 57 at the interface 59 between the two organic layers 56 and 57. These electrons are transported laterally towards the insulator edge 54 by field-effect conduction. In the vicinity of the insulator edge excitons are formed on the light-emitting dye, btp2Ir (acac). Recombination of these excitons results in red light emission near the insulator edge 54. Light intensity can be tuned by changing the voltage bias applied to the first charge injecting electrode 52 or by changing the distance between the second charge injecting electrode 58 and the insulator edge 54. The light emission spectrum and the current-voltage characteristics of this device are shown in FIG. 9 and FIG. 10 respectively.

Recombination of excitons occurs in the vicinity of the insulator edge 54. This is demonstrated experimentally as well as by simulations. An image of the light-emission 50 in this structure was made when the electrodes were biased according to the measurement shown in FIG. 10. This image shows that light-emission 50 indeed occurs essentially near the edge of the insulator in the light-emitting layer. This is confirmed by simulations.

The invention claimed is:

1. A two-terminal light-emitting device comprising:
an active layer comprising two or more organic semiconductor layers;
a first electrode in contact with the active layer for injecting charge carriers of a first type into the active layer, at least part of the first electrode defining a first electrode plane and a thickness dimension substantially orthogonal to the first electrode plane;
a patterned electrically insulating layer in contact with the active layer, at least a portion of the electrically insulating layer
overlaying part of the first electrode,
defining an insulating layer plane substantially parallel to the first electrode plane,
defining a thickness dimension substantially orthogonal to the insulating layer plane and having a thickness along the thickness dimension that is substantially uniform, and
having an edge with a thickness substantially the same as the substantially uniform thickness of the part of the electrically insulating layer, a point on the edge defining an insulating layer edge plane that is orthogonal to the insulating layer plane, the electrically insulating layer being on one side of the insulating layer edge plane and not on the other side; and
a second electrode in contact with the active layer for injecting charge carriers of a second type into the active layer, the second type of charge carriers being of opposite polarity from the first type of charge carriers, at least part of the second electrode
overlaying some of the portion of the electrically insulating layer that is overlaying part of the first electrode,
defining a second electrode plane substantially parallel to the first electrode plane,
defining a thickness dimension substantially orthogonal to the second electrode plane and having a thickness along the thickness dimension that is substantially uniform, and
having an edge with a thickness substantially the same as the substantially uniform thickness of the part of the second electrode, a point on the edge defining a second electrode edge plane that is orthogonal to the second electrode plane, the second electrode being on one side of the second electrode edge plane and not on the other side,
wherein the second electrode edge plane intersects both the electrically insulating layer and the first electrode, and
wherein the insulating layer edge plane intersects the first electrode but not the second electrode, the insulating layer edge plane and second electrode edge plane being offset from one another by a predetermined distance so as to form an offset top surface portion of the electrically insulating layer that does not overlap with the second electrode, wherein an accumulation layer of charge carriers is formed inside of the active layer at an interface between two of the two or more organic semiconductor layers at the offset top surface portion when a voltage is applied to the first and second electrodes so as to emit light from a region in the active layer above the offset top surface portion.

2. The two-terminal light-emitting device according to claim 1, wherein the active layer comprises a first organic semiconductor layer and a second organic semiconductor layer, wherein the first organic semiconductor layer is in contact with the electrically insulating layer.

3. The two-terminal light-emitting device according to claim 2, wherein the first organic semiconductor layer comprises polymers and the second organic semiconductor layer comprises small molecules.

4. The two-terminal light-emitting device according to claim 2, wherein the first organic semiconductor layer is confined to a region overlaying the first electrode and bounded by the insulating layer plane and the insulating layer edge plane.

5. The two-terminal light-emitting device according to claim 2, wherein the second electrode is in contact with the second organic semiconductor layer.

6. The two-terminal light-emitting device according to claim 5, wherein the second electrode is further in contact with the first organic semiconductor layer.

7. The two-terminal light-emitting device according to claim 1, wherein the active layer comprises a first organic semiconductor layer, a second organic semiconductor layer, and a third organic semiconductor layer, wherein the first organic semiconductor layer is in contact with the electrically insulating layer.

8. The two-terminal light-emitting device according to claim 7, wherein the first and second organic semiconductor layers are confined to a region overlaying the first electrode and bounded by the insulating layer plane and the insulating layer edge plane.

9. The two-terminal light-emitting device according to claim 7, wherein the second electrode is in contact with the third organic semiconductor layer.

10. The two-terminal light-emitting device according to claim 9, wherein the second electrode is further in contact with the second organic semiconductor layer.

11. The two-terminal light-emitting device according to claim 7, wherein the accumulation layer of charge carriers is formed at the interface between the first organic semiconductor layer and the second organic semiconductor layer.

12. The two-terminal light-emitting device according to claim 7, wherein the accumulation layer of charge carriers is formed at the interface between the second organic semiconductor layer and the third organic semiconductor layer.

13. The two-terminal light-emitting device according to claim 1, wherein the predetermined distance is between 100 nanometers and 1000 micrometers.

14. The two-terminal light-emitting device according to claim 1, wherein the charge carriers of the first type diffuse before recombining with charge carriers of the second type.

15. The two-terminal light-emitting device according to claim 1, wherein the charge carriers of the second type drift over the predetermined distance before recombining with charge carriers of the first type.

16. The two-terminal light-emitting device according to claim 1, wherein the insulating layer has a thickness between 1 nanometer and 1 micrometer.

17. The two-terminal light-emitting device according to claim 1, wherein the two or more organic semiconductor layers comprise at least one organic semiconductor layer of small molecules.

18. The two-terminal light-emitting device according to claim 1, wherein the two or more organic semiconductor layers comprise at least one organic semiconductor layer of polymers.

19. The two-terminal light-emitting device according to claim 1, wherein the two or more organic semiconductor layers comprise at least one organic semiconductor layer of metal complexes.

20. The two-terminal light-emitting device according to claim 1, wherein the charge carriers of the first type diffuse by ohmic conduction.

21. The two-terminal light-emitting device according to claim 1, wherein the charge carriers of the first type diffuse by space charge limited conduction.

22. The two-terminal light-emitting device according to claim 1, wherein the charge carriers of the second type drift by field-effect conduction.

23. The two-terminal light-emitting device according to claim 22, wherein the field-effect conduction takes place in one of the two or more organic semiconductor layers that has high mobility for the charge carriers of the second type.

24. The two-terminal light-emitting device according to claim 1, wherein the active layer further comprises at least one additional organic layer, wherein the additional organic layer is a light-emitting layer.

25. The two-terminal light-emitting device according to claim 1, wherein the active layer further comprises at least one additional organic layer, wherein the additional organic layer is an electron-blocking layer.

26. The two-terminal light-emitting device according to claim 1, wherein the active layer further comprises at least one additional organic layer, wherein the additional organic layer is a hole-blocking layer.

27. The two-terminal light-emitting device according to claim 1, wherein the active layer further comprises at least one additional organic layer, wherein the additional organic layer is a transport layer.

28. The two-terminal light-emitting device according to claim 1, wherein the active layer further comprises at least one additional organic layer, wherein the additional organic layer is an optical confinement layer.

29. The two-terminal light-emitting device according to claim 28, wherein at least one of the two or more organic semiconductor layers in the active layer is a light-emitting layer.

30. The two-terminal light-emitting device according to claim 29, wherein the optical confinement layer has a refractive index lower than a refractive index of the light-emitting layer.

31. The two-terminal light-emitting device according to claim 1, wherein the first electrode is transparent to the light emitted by the two-terminal light-emitting device.

32. The two-terminal light-emitting device according to claim 1, further comprising an optical feedback structure.

33. The two-terminal light-emitting device according to claim 32, wherein the optical feedback structure is a distributed Bragg reflector.

34. The two-terminal light-emitting device according to claim 32, wherein the optical feedback structure is a distributed optical feedback structure.

35. The two-terminal light-emitting device according to claim 32, wherein the optical feedback structure is a mirror.

36. The two-terminal light-emitting device according to claim 1, further comprising:
 at least one optical confinement structure; and
 at least one optical resonator,
 wherein the light emitted from the two-terminal light-emitting device is coherent and laser emission is achieved.

* * * * *